United States Patent [19]
Konantz et al.

[11] 3,990,094
[45] Nov. 2, 1976

[54] EVAPORATED SOLDERABLE MULTILAYER CONTACT FOR SILICON SEMICONDUCTOR

[75] Inventors: Mark L. Konantz, Indianapolis; Ronald K. Leisure, Kokomo, both of Ind.

[73] Assignee: General Motors Corporation, Detroit, Mich.

[22] Filed: Aug. 20, 1975

[21] Appl. No.: 605,979

[52] U.S. Cl. .................................... 357/71; 357/65
[51] Int. Cl.² .......................................... H01L 23/48
[58] Field of Search ............................... 357/65, 71

[56] References Cited
UNITED STATES PATENTS
3,886,585   5/1975   Konantz et al. ...................... 357/71

Primary Examiner—Edward J. Wojciechowicz
Attorney, Agent, or Firm—Robert J. Wallace

[57] ABSTRACT

An evaporated multilayer solderable low resistance contact for N-type and P-type regions on a semiconductor body comprising an aluminum layer directly on the semiconductor body, an evaporated manganese layer on the aluminum layer and an evaporated nickel layer on the manganese layer.

2 Claims, 1 Drawing Figure

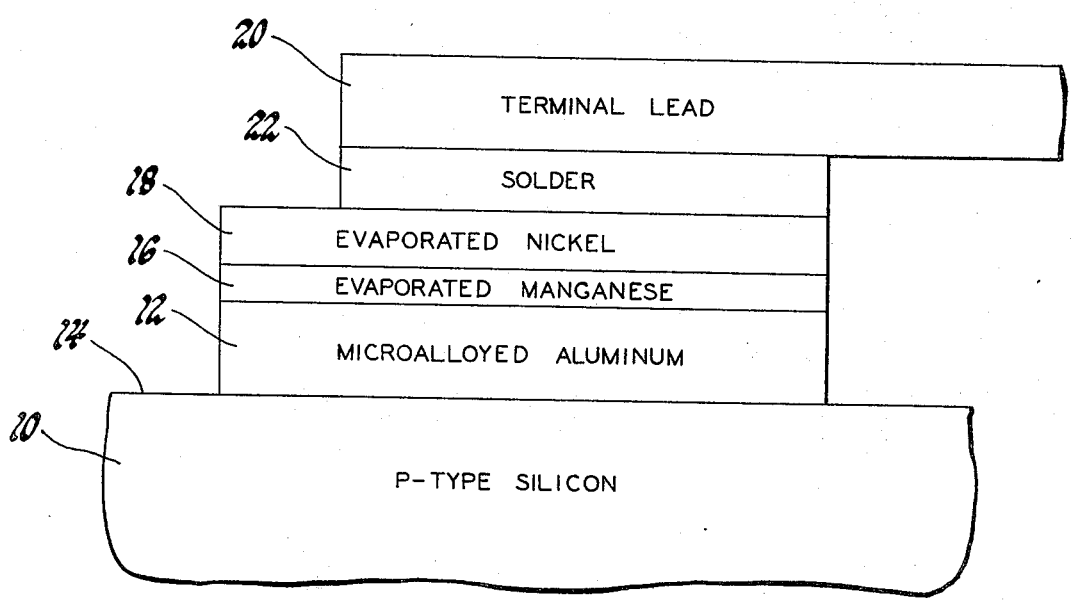

3,990,094

EVAPORATED SOLDERABLE MULTILAYER CONTACT FOR SILICON SEMICONDUCTOR

BACKGROUND OF THE INVENTION

This invention relates to ohmic contacts and semiconductor bodies and more particularly to an improved multilayer low resistance solderable contact that can be used on both N-type silicon and P-type silicon.

In the past, nickel layers have been used as single layer solderable ohmic contacts directly on N-type silicon. In such contacts, the nickel layer is applied by electroless deposition from an aqueous solution containing nickel sulfate and sodium hypophosphite. The plated silicon body is heated after the nickel is deposited. After heating at a moderate temperature, the nickel layer has a low contact resistance on N-type silicon. This is due to a significant phosphorus concentration in the nickel layer. However, the phosphorus concentration that reduces contact resistance on N-type silicon, increases it on P-type silicon. Hence, for lowest resistance solderable ohmic contacts on P-type silicon, other approaches have been used.

Excellent low resistance contacts are regularly made to P-type silicon with a specially microalloyed aluminum layer. However, aluminum is not readily solderable. It is generally known to coat aluminum with one or more layers of another metal, to provide an outer layer that is solderable. Various metals and deposition techniques can be used in making semiconductor devices, vacuum deposition is frequently used. Coatings of pure nickel can be conveniently applied to aluminum by a vacuum deposition. Pure nickel provides a highly solderable surface and does not introduce undesirable impurities to the semiconductor surface. However, the adhesion of pure nickel to aluminum is unsatisfactory. It is not as strong as the aluminum-silicon bond, or the nickel-solder bond.

We have found that it is as difficult to get pure nickel to satisfactorily adhere to aluminum as it is to get solder to do so. For example, when a silicon element having an aluminum-pure nickel multilayer contact is soldered to a supporting substrate and subjected to bending stresses, the nickel separates from the aluminum to produce electrode failure.

In our U.S. Pat. No. 3,886,585 entitled "Solderable Multilayer Contact for Silicon Semiconductor" we disclosed that a vacuum deposited manganese-nickel alloy adhered better than pure nickel to an aluminum surface. Moreover, the manganese-nickel alloy did not introduce undesirable impurities to the semiconductor surface, increase the number of processing steps, or reduce solderability.

Such an alloy is readily deposited by sputtering, and by more sophisticated electrical resistance evaporation techniques. However, it is not so readily deposited, particularly under commercial production conditions, with a multiple source electron beam evaporation apparatus or the more rudimentary filament type electrical resistance heated evaporation apparatus. Vapor pressure differences between the nickel and manganese can produce control problems with the latter apparatus that are objectionable for commercial production operations. A given commercial production facility may have a substantial capital investment in this latter vacuum deposition apparatus. If so, it may not be economically prudent to convert to sputtering apparatus or to a more sophisticated electrical resistance heated evaporation apparatus. In such instance there may be a reluctance to use our prior invention in that given production facility.

On the other hand, we have found that the manganese and nickel need not be simultaneously evaporated as an alloy. Extremely adherent solderable contacts can be obtained by successively evaporating the manganese and nickel in a single evacuation step. High yields can be consistently obtained under commercial production conditions with the multiple source electron beam heated evaporation apparatus and with the more rudimentary filament type resistance heated evaporation apparatus referred to earlier. Also, sputtering apparatus or more sophisticated electrical resistance heated evaporation apparatus can be used, but are preferably used with our invention disclosed in the aforementioned U.S. Pat. No. 3,886,585.

OBJECTS AND SUMMARY OF THE INVENTION

The principal objects of this invention are to provide an improved evaporated multilayer solderable contact on silicon and method of producing such a contact that is particularly useful with selected commercial production vacuum deposition apparatus. These and other objects of the invention are obtained with an aluminum layer on silicon, and successively evaporated layers of manganese and nickel. The manganese and nickel are preferably evaporated in a single evacuation step.

BRIEF DESCRIPTION OF THE DRAWING

The FIGURE in the drawing diagrammatically shows a terminal lead soldered to a multilayered electrode made in accordance with the invention.

DESCRIPTION OF THE PREFERRED EMBODIMENT

The contact of this invention can be used to ohmically attach a semiconductor die to a supporting substrate, or to ohmically attach a terminal lead to the die. The drawing illustrates the latter, and serves as one specific example of the invention. The layers shown are not drawn to scale, to better illustrate the novel multilayer contact involved. The multilayer contact is formed on a P-type portion 10 of a silicon semiconductor device. This portion, for example, can be the collector region of a PNP transistor or the base region of an NPN transistor. The film 12 of aluminum is on the surface 14 of portion 10, and microalloyed thereto. This produces a low resistance electrical connection, an ohmic contact, between the aluminum layer 12 and P-type silicon portion 10. Aluminum film 12 can be about 3000 – 15000 angstroms thick. Its thickness is no more critical in the electrode of this invention than it is in the usual single layer aluminum ohmic contacts on N-type and P-type silicon.

A 1000 angstroms thick film 16 consisting essentially of manganese is on the aluminum layer 12. We prefer the manganese be substantially pure, except for electronically neutral metals that may enhance adhesion to the microalloyed aluminum and to the nickel. By electronically neutral metals we mean metals that are not conductivity determining impurities in silicon. Film 16 has an average thickness of at least 800 angstroms to obtain a substantially continuous layer. Thinner layers may be useful but are difficult to measure and their deposition is difficult to control, particularly with respect to thickness uniformity. We have found no upper limit on manganese thickness that can be used. However, using a film thickness that is any greater than necessary to insure complete aluminum coverage with the apparatus used appears to provide no increased benefits. We prefer to use a thickness below about 2500 angstroms. Essentially, using a significantly thicker manganese film merely increases evaporation time and expense. Of course, an increase in evaporation time slows production rate through a given evaporation apparatus.

A film 18 consisting essentially of nickel is on the manganese film 16. For commercial production operations we prefer that nickel film 18 be substantially pure, except for electronically neutral metal content which may enhance solderability and/or adhesion of the nickel layer to the evaporated manganese.

The average thickness of nickel film 18 can be varied over broad limits. However, sufficient nickel must be present to provide a continuous coating on the manganese film and allow good solderability. An average thickness greater than about 3000 angstroms is usually necessary to insure that a nickel coating will not only be continuous initially but remain so after solutioning effects of the solder. Average nickel thicknesses greater than about 5000 angstroms offer no significant advantage in reliability or yields. Such thicker layers increase cost and slow down output of given evaporation apparatus, similar to increased thickness of manganese film 16.

A Kovar terminal lead 20 is attached to the nickel film 18 by means of an interjacent solder layer 22. Solder layer 22 can be of any suitable solder, such as 90% by weight lead and 10% by weight tin.

In essence, our sequential manganese-nickel multilayer coating provides the same two purposes as the single manganese-nickel alloy layer in our aforementioned U.S. Pat. No. 3,886,585. It provides an adherent coating on a microalloyed aluminum film, and also provides a coating that has a solderable surface. Solder is not the only metal that will readily adhere to nickel film 18. Thus, the nickel layer need not be the last or outer layer of our solderable electrode. One or more additional vacuum deposited layers of metal could be used over our nickel film 18, so long as the last layer applied provides a solderable surface. Additional layers of pure nickel, silver or gold might be used. On the other hand, since our nickel film 18 is itself quite solderable, we prefer to use only the three layers, aluminum 12, manganese 16 and nickel 18. Any additional layers would preferably be applied by evaporation rather than sputtering, and be applied in a single evaporation step using a multiple source evaporation apparatus.

As in our aforementioned U.S. Pat. No. 3,886,585 our electrode is of special interest in providing an adherent low resistance solderable contact for P-type silicon, because no such contact is available for P-type silicon. On the other hand, it works equally well on N-type silicon. Silicon devices usually have both N-type and P-type regions. In this invention the same metallization system can be used for good solderable contacts on both conductivity type regions. Our multilayered electrode can be used on both conductivity type regions because the initial layer of our contact is a microalloyed aluminum film. It is solderable because the outer layer is of a solderable metal. The difficulty with such a contact is getting adequate adhesion between the aluminum and the subsequently applied metal layers. It is normally the weakest adhesion link in the electrode metallization system.

Our manganese and nickel films can be successively vacuum deposited directly onto a new or old microalloyed film. As previously pointed out, this particular metallization system is particularly useful in connection with less sophisticated resistance heated filament type or electron beam heated evaporation apparatus. Such apparatus has been used extensively in commercial production operations in the semiconductor industry. Only the usual degree of care need be used to consistently obtain extremely highly adherent solderable contacts under commercial production conditions. It is recognized that deposition of two layers takes more evaporation time than that of a single layer, such as in our prior invention. However this evaporation time can be reduced if both the manganese and nickel layers are successively deposited in a multiple source evaporation apparatus in a single evacuation step. This type of apparatus is already widely used in commercial production operations.

To make an adherent solderable multilayer electrode in accordance with this invention, a clean silicon substrate is placed in a vacuum evaporation chamber, and the chamber pumped down to a pressure of about $1 \times 10^{-6}$ Torr. The silicon substrate is preferably moderately warm to enhance adhesion of the aluminum to the silicon. While any substrate temperature up to about 300° C. can be used, temperatures in excess of 150° C. provide best results, and we prefer 200° C. Aluminum is then evaporated from a tungsten electrical resistance heater onto the warm silicon substrate until a 10,000 angstrom thick layer of aluminum is deposited on the substrate. The substrate is then removed from the evaporation chamber, and the aluminum layer microalloyed to the substrate surface. For microalloying, the aluminum coated substrate is placed for 3 – 5 minutes in a furnace tube that is heated to a temperature of about 500° – 575° C. and has an argon atmosphere. The substrate is then immediately removed from the furnace tube and allowed to cool in room air to room temperature. After cooling to room temperature, the substrate is placed back in the vacuum evaporation chamber. The vacuum evaporation chamber is again evacuated to a pressure of $1 \times 10^{-6}$ Torr. As with the aluminum layer, the silicon substrate is preferably moderately warmed during the vacuum deposition in this chamber. A substrate temperature of about 200° – 260° C. is preferred. A 1000 angstrom thick manganese film is then evaporated onto the microalloyed aluminum layer from a tungsten resistance heater. If the evaporation apparatus is of the multiple source type, a second source is then activated and a nickel film is then evaporated onto the manganese film. The substrate is then cooled to less than 100° C., the vacuum chamber brought to atmospheric pressure, and the substrate removed from the chamber.

If the apparatus is not of the multiple source evaporation type, the substrate is cooled and the vacuum chamber opened as mentioned in the preceding paragraph. However, the substrate is retained in position in the chamber and the tungsten electrical resistance heater is loaded with nickel. The chamber is then closed and evacuated again to a pressure of $1 \times 10^{-6}$ Torr. The substrate is heated again to a temperature of about 200° – 260° C., and the nickel evaporated onto the manganese film. The substrate is then cooled again to a temperature of less than 100° C., the chamber brought up to atmospheric pressure, opened, and the substrate removed from the vacuum evaporation chamber. A terminal lead 20 can then be soldered to the nickel film 18 in the usual manner.

It should also be recognized that all the layers of our multilayer contact, including the aluminum layer, can be produced in a single evacuation step. The substrate need not be removed from the vacuum evaporation chamber for microalloying. However, multiple source vacuum deposition equipment would be required. Moreover, it must have the capability of heating the silicon substrate to a microalloying temperature, and then quickly cooling it back to the vacuum deposition temperature. In such event the substrate is placed in the vacuum deposition chamber, the chamber pumped down to a pressure of about $1 \times 10^{-6}$ Torr and the substrate concurrently moderately heated. A 10,000 angstrom thick aluminum layer is then deposited onto the substrate, the substrate heated to about 500° – 575° C. for approximately 3 – 5 minutes, and then quickly cooled to about 200° – 260° C. As is known, if quick cooling is not provided, the contact will still be of low resistance on P-type silicon but not on N-type silicon. Aftr the quick cooling the manganese and nickel films can then be successively deposited onto the microalloyed aluminum layer in the manner hereinbefore described. In this connection it should be mentioned that different metals can be evaporated in a single evaporation chamber usually by simply rotating another source or target into position, or unshielding another source, without opening the vacuum evaporation chamber. An aging bake could be added but, because of the time involved, the slices would have to be removed from the system for this step. The aging bake step is used after the aluminum layer is microalloyed to the silicon substrate surface. In the aging bake step, the silicon substrate having the microalloyed aluminum layer on it is heated for 4 hours at about 400° C. in dry air. The aging bake step after microalloying is a known and accepted procedure preferred by some and omitted by others. It is no more important to this invention than it is in other microalloyed aluminum contacts.

We claim:
1. A strong low resistance solderable multilayer electrode on a silicon semiconductor body comprising a semiconductive body of silicon having a surface, a microalloyed layer of aluminum on said surface in low electrical resistance contact therewith, an evaporated manganese layer on said aluminum layer at least about 800 angstroms thick, and an evaporated nickel layer on said manganese layer at least about 3000 angstroms thick.

2. A strong low resistance solderable multilayer electrode on a silicon semiconductor body comprising a body of silicon having a surface, an aluminum first layer on said surface in low electrical resistance contact therewith, said aluminum first layer being about 3000 – 15,000 angstroms thick and microalloyed to said silicon, an evaporated manganese layer on said aluminum layer about 800 – 2500 angstroms thick, and an evaporated nickel layer on said manganese layer about 3000 – 5000 angstroms thick.

* * * * *